United States Patent
Tsuno et al.

(10) Patent No.: US 10,879,037 B2
(45) Date of Patent: Dec. 29, 2020

(54) CHARGED PARTICLE BEAM DEVICE WITH DISTANCE SETTING BETWEEN IRRADIATION REGIONS IN A SCAN LINE

(71) Applicant: HITACHI HIGH-TECH CORPORATION, Tokyo (JP)

(72) Inventors: Natsuki Tsuno, Tokyo (JP); Naomasa Suzuki, Tokyo (JP); Atsushi Okita, Tokyo (JP); Muneyuki Fukuda, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 16/088,771

(22) PCT Filed: Apr. 27, 2016

(86) PCT No.: PCT/JP2016/063177
§ 371 (c)(1),
(2) Date: Sep. 26, 2018

(87) PCT Pub. No.: WO2017/187548
PCT Pub. Date: Nov. 2, 2017

(65) Prior Publication Data
US 2019/0051490 A1 Feb. 14, 2019

(51) Int. Cl.
*H01J 37/28* (2006.01)
*G01N 23/225* (2018.01)
*H01J 37/26* (2006.01)

(52) U.S. Cl.
CPC ............ *H01J 37/28* (2013.01); *G01N 23/225* (2013.01); *H01J 37/265* (2013.01);
(Continued)

(58) Field of Classification Search
CPC .. H01J 37/28; H01J 37/265; H01J 2237/2809; H01J 2237/004; H01J 2237/043; G01B 15/04; G01N 23/225
See application file for complete search history.

(56) References Cited

U.S. PATENT DOCUMENTS

| | | | | |
|---|---|---|---|---|
| 5,006,795 A | * | 4/1991 | Yoshizawa | G01R 31/305 250/311 |
| 2007/0024528 A1 | * | 2/2007 | Kobaru | H01J 37/265 345/32 |

(Continued)

FOREIGN PATENT DOCUMENTS

| | | |
|---|---|---|
| JP | 4-017248 A | 1/1992 |
| JP | 2012-252913 A | 12/2012 |

OTHER PUBLICATIONS

International Search Report dated Jul. 12, 2016, in International Application No. PCT/JP2016/063177.

*Primary Examiner* — Brooke Purinton
(74) *Attorney, Agent, or Firm* — Miles & Stockbridge, P.C.

(57) ABSTRACT

To provide a charged particle beam device which enables observation and evaluation of the surface and the inside of a sample with low damage to the sample, the charged particle beam device has: a charged particle beam source 2; a sample table 9 in which the sample 210 is placed; a charged particle beam optical system which pulsates a charged particle beam 100 and irradiates the charged particle beam to the sample at an acceleration voltage within a range of 0 kV to 5 kV; a split distance selector 125 for selecting a measurement object of the sample; and a split distance setting unit 124 for setting a split distance in one line scanning of the charged particle beam on the sample.

13 Claims, 12 Drawing Sheets

(52) U.S. Cl.
CPC ... *H01J 2237/004* (2013.01); *H01J 2237/043* (2013.01); *H01J 2237/2809* (2013.01)

(56) References Cited

U.S. PATENT DOCUMENTS

| | | | |
|---|---|---|---|
| 2009/0224151 A1* | 9/2009 | Hatakeyama | H01J 37/244 250/307 |
| 2011/0163230 A1* | 7/2011 | Hiroi | H01J 37/20 250/310 |
| 2014/0097342 A1 | 4/2014 | Tsuno et al. | |
| 2015/0357154 A1* | 12/2015 | Yokosuka | H01J 37/147 250/310 |

\* cited by examiner

FIG. 3
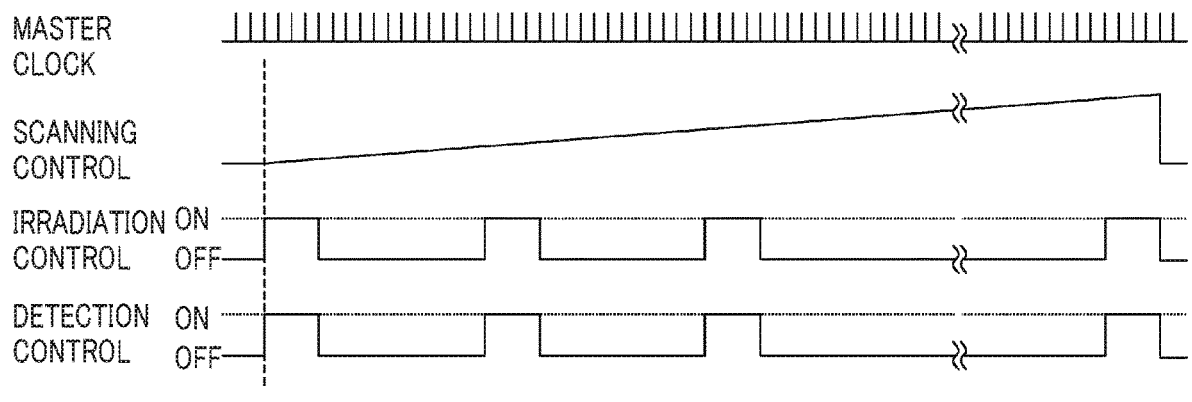
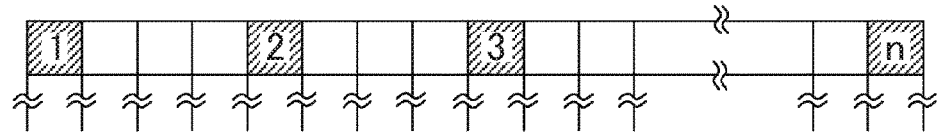
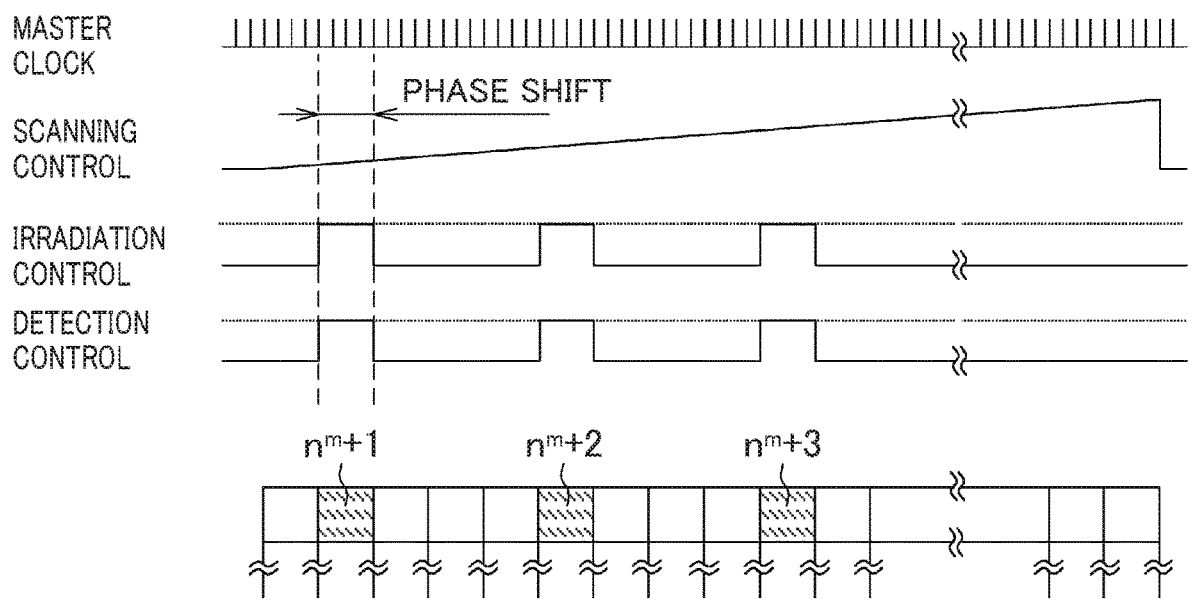

FIG. 13

SEM IMAGE ACQUISITION OPERATION — 126

OBSERVATION CONDITIONS

- ACCELERATION VOLTAGE: 300 V
- IRRADIATION CURRENT: 10 pA
- SCANNING SPEED: TV scan — 122
- OBSERVATION MAGNIFICATION: 100000 TIMES — 131
- SAMPLE ELECTRIC FIELD: 1000 V/mm — 132

OBSERVATION INFORMATION

- ⦿ ELECTRIC CHARACTERISTIC (2-6pixel): 8 pixel — 124
  - SCANNING INTERVAL: 4 pixel — 123
- ○ SURFACE SHAPE (>6pixel): 32 pixel
  - SCANNING INTERVAL: 16 V/mm

137

SEM IMAGE — 120

DEFECT INFORMATION

COORDINATES (150.120, 220.222)
DEFECT TYPE
(JUNCTION SHORT CIRCUIT)

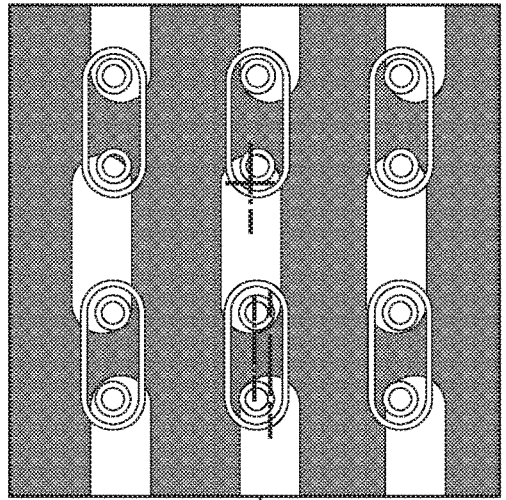

CHARGED PARTICLE BEAM DEVICE WITH DISTANCE SETTING BETWEEN IRRADIATION REGIONS IN A SCAN LINE

TECHNICAL FIELD

The present invention relates to a charged particle beam device.

BACKGROUND ART

A charged particle beam device such as an electron microscope is available for performing magnification observation on a sample using an electron beam, and is utilized in nano-level minute shape observation and composition analysis. Especially, a scanning type electron microscope (hereinbelow, abbreviated to SEM) has a characteristic that it is available for analysis in milli-order low magnification to nano-order high magnification without limitation of sample size. The SEM is widely used in analysis of form and composition of a functional material, minute pattern measurement inspection of a semiconductor device, and the like. In the analysis of form and composition, and measurement inspection of a minute pattern, not only analysis of sample surface information but also analysis of information in a cross-sectional direction such as material and structure inside the sample is required. When the information in the cross-sectional direction is obtained, generally the sample is cut and cross section observation is performed. However, it is destructive observation.

As a SEM method for non-destructive analysis of the inside of a sample, a method of controlling an electron-beam acceleration voltage applied to an electron source is known. In the SEM, the energy of the electron beam irradiated to the sample is adjusted by control of the acceleration voltage. The depth of entrance of the electron beam in the sample depends on the energy of the electron beam. Reflection electrons are emitted from the internal structure in the depth position where the electron beam entered. A SEM image mainly having inner information of the sample is obtained by detecting the reflection electrons. Further, Patent Literature 1 discloses a method of controlling electron irradiation amount and an irradiation waiting period with a pulse electron beam, so as to realize observation of a structure hidden with potential contrast due to electrostatic charging caused by charging and discharging to/from the sample. The potential contrast reflects the difference of the surface potential caused by electrostatic charging with the irradiation of the electron beam. The difference of surface potential is caused by the difference of electric characteristics (resistance and electrostatic capacity) of the sample. Since the electric characteristics of the sample differ based on existence/non-existence of internal structure of the sample, the internal structure is visualized with charging-controlled potential contrast. Further, as a technique for suppressing electrostatic charging with a pulse electron beam, Patent Literature 2 discloses a method for controlling a split distance between irradiated pixels by synchronous control between a pulse electron beam and scanning, so as to suppress image failure during observation due to electrostatic charging.

CITATION LIST

Patent Literature

Patent Literature 1: Japanese Unexamined Patent Application Publication No. 2012-252913
Patent Literature 2: Japanese Unexamined Patent Application Publication No. Hei 04-017248

SUMMARY OF INVENTION

Technical Problem

When the acceleration voltage is controlled for observation of the internal structure, it is necessary to cause infiltration of the electron beam to the internal structure. Accordingly, the acceleration voltage is raised, and the sample is damaged. Further, since the reflection electrons are detected, the contrast is low between materials having a small atomic mass difference. Further, as in the case of Patent Literature 1, in a material where the influence of electrostatic charging is strong (material with high permittivity and high insulation) made on the periphery, with respect to the difference of electric characteristics in the irradiation position, the influence of the peripheral electrostatic charging is strong, and the contrast is not sufficiently obtained. Further, Patent Literature 2 discloses a method of suppressing electrostatic charging with synchronous control between a pulse electron beam and scanning. In this method, a split distance for reduction of influence of previous irradiation in accordance with distance is defined. It has been found that in this method, the electrostatic charging caused in the periphery does not influence, however, in a material where the difference of electric characteristics in the irradiation position is small, the contrast is low.

The present invention has an object to provide a charged particle beam device which enables observation and evaluation of the surface and the inside of a sample with low damage to the sample.

Solution to Problem

As an embodiment to attain the above object, there is provided a charged particle beam device including: a charged particle beam source; a sample table on which a sample is placed; a charged particle beam optical system that accelerates and pulsates a charged particle beam emitted from the charged particle beam source, and irradiates the charged particle beam to the sample at an acceleration voltage within a range of 0 kV to 5 kV while scanning the charged particle beam; a split distance selector that selects a surface or an under layer of the sample as a measurement object; a split distance setting unit that sets a split distance as a distance between irradiation regions in one line scanning of the charged particle beam on the sample, based on the measurement object selected with the split distance selector; and a controller that controls the charged particle beam optical system based on the split distance set with the split distance setting unit, so as to irradiate the charged particle beam to the sample.

Further, as another embodiment, there is provided a charged particle beam device including: a charged particle beam source; a sample table on which a sample is placed; a charged particle beam optical system that accelerates and pulsates a charged particle beam emitted from the charged particle beam source, and irradiates the charged particle beam to the sample at an acceleration voltage within a range of 0 kv to 5 kV while scanning the charged particle beam; a GUI that displays a split distance setting screen for setting a split distance as a distance between irradiation regions in one line scanning of the charged particle beam on the sample, based on a measurement object selected with a split distance selection screen for selecting a surface or an under layer of the sample as the measurement object and the split distance selection screen; and a controller that controls the charged particle beam optical system to irradiate the charged particle beam to the sample based on the split distance set with the split distance setting screen.

Advantageous Effects of Invention

According to the present invention, it is possible to provide a charged particle beam device which enables observation and evaluation of the surface and the inside of a sample with low damage to the sample.

BRIEF DESCRIPTION OF DRAWINGS

FIG. 3 is a diagram showing an example of a time chart of image forming control in the electron microscope according to the first embodiment.

FIG. 13 is a diagram showing an example of the GUI in the electron microscope according to the third embodiment.

FIG. 17 is a diagram showing an example of the GUI in the electron microscope according to the fourth embodiment.

DESCRIPTION OF EMBODIMENTS

Figure 1:
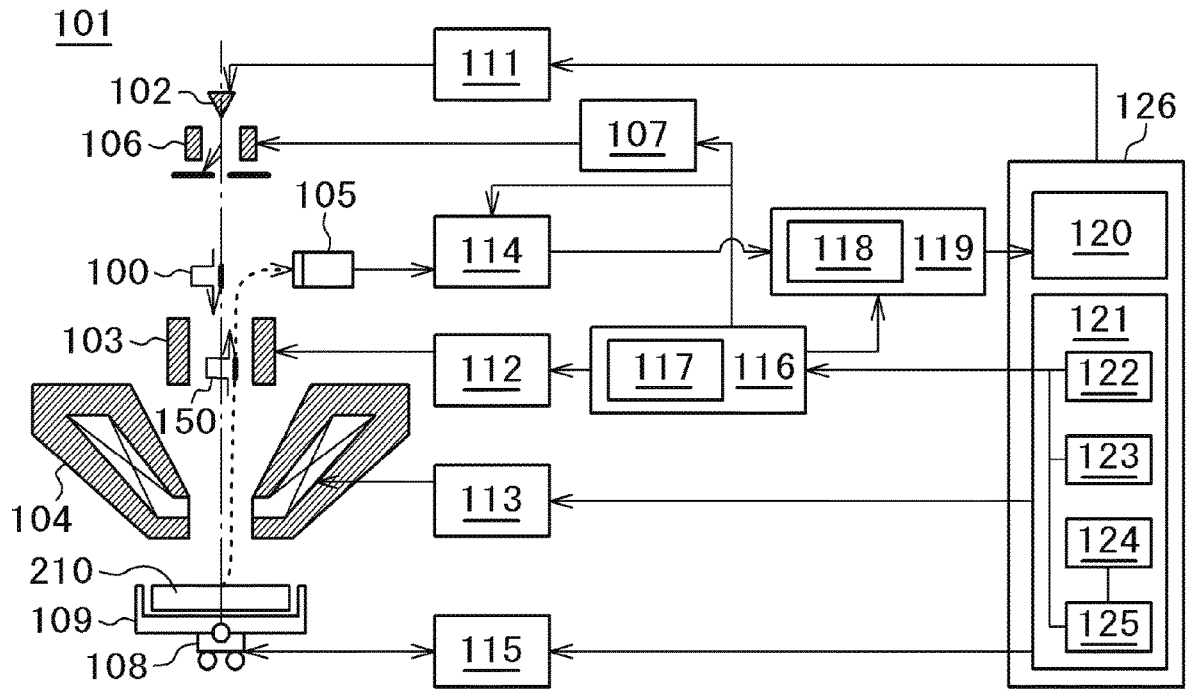
FIG. 1 is a configuration cross-sectional diagram (partial block diagram) showing an example of a charged particle beam device (electron microscope) according to a first embodiment.

When a sample is an insulator, the surface of the sample is electrostatically charged by irradiation of an electron beam. A secondary electron emission rate σ is a rate of secondary electron emission amount with respect to electron irradiation amount. The secondary electron emission rate σ varies in accordance with time by electrostatic charging with the electron beam irradiation. At this time, the contrast CNR of a SEM image is a difference of secondary electron emission rate between a region A and region B. In the sample which is electrostatically charged and in which the secondary electron emission rate varies in accordance with time, the CNR is represented with the following expression (1).

[Expression 1]

$$CNR = (\sigma_{iA} - 1)\int_0^{tp} e^{(-t/\tau_A)} dt - (\sigma_{iB} - 1)\int_0^{tp} e^{(-t/\tau_B)} dt \quad (1)$$

Note that $\sigma_i$ is a true secondary electron emission rate proper to a material which is not influenced by electrostatic charging; τ is a time constant of time variation of the secondary emission rate by electrostatic charging; and tp, electron irradiation time per unit area (pixel). Note that an electric charge Q accumulated in the sample is represented with the following expression (2).

[Expression 2]

$$Q = (\sigma_i - 1)\int_0^{tp} e^{(-t/\tau)} dt \quad (2)$$

Further, Q is represented with the following expression (3).

[Expression 3]

$$Q = CV \quad (3)$$

Note that C is electrostatic capacitance; and V, a surface potential of the sample. From the expressions (1), (2) and (3), it is understood that the contrast is a difference of the electric charge Q accumulated in the sample, and the contrast depends on the electrostatic capacitance C and the surface potential V of the sample. Further, the electrostatic capacitance C is represented with the following expression (4).

[Expression 4]

$$C = \varepsilon \cdot S/d \quad (4)$$

Note that ε is permittivity of the material; and d, the thickness of the material. Further, generally, S is an irradiation area (beam diameter, pixel size).

However, the inventors have found that it is possible to control the electrostatic capacitance C which influences the electrostatic charging, with a split distance between irradiated regions. When split irradiation jumping between pixels is performed, in the split distance influenced by electrostatic charging upon previous irradiation, the area S is increased, as a result, the electrostatic capacitance C is increased. Further, as irradiation is performed with a split distance not influenced by the electrostatic charging upon previous irradiation, the area S is an irradiation area as a beam diameter or a pixel size. That is, when the internal structure and the difference of electric characteristic are to be visualized, it is possible to enhance the potential contrast by setting the split distance to a distance influenced by electrostatic charging upon previous irradiation. Further, when the surface shape is to be observed, it is possible to enhance the shape contrast by setting the split distance to a distance not influenced by electrostatic charging upon previous irradiation. Further, in the present method, it is not necessary to cause infiltration of the electron beam to the inside. As a low acceleration voltage of 5 kV or lower appropriate to control of electrostatic charging is used, it is possible to suppress damage to the sample by electron beam irradiation.

The present invention is made based on these findings related to transition characteristics of the secondary electron emission rate. An electron microscope according to the present invention to observe the surface shape and the internal structure has electron-beam intermittent irradiation means with a fixed time base, secondary electron detection means synchronized with the time base, electron-beam irradiation position control means synchronized with the time base, means for setting a distance between irradiation positions in correspondence with desired sample information, means for controlling interval time between the intermittent irradiations in the distance between the irradiation positions, and means for obtaining an image while maintaining the distance between the irradiation positions.

According to the present invention, it is possible to select shape contrast or potential contrast with split distance between irradiated regions. Accordingly, it is possible to provide an electron microscope having a function of discriminably displaying an image reflecting the surface shape of a sample, the internal structure, a buried interfacial state, and electric characteristic of the sample, with an electron beam at a low acceleration voltage.

Hereinbelow, using the drawings, the present invention will be described with embodiments. Note that in the embodiments, an electron microscope is used as an example, however, the present invention is not limited to the electron beam device, but is applicable to a device using an ion beam such as an ion microscope.

First Embodiment

A scanning electron microscope (SEM) according to a first embodiment of the present invention will be described using FIGS. 1 to 7. In the present embodiment, the scanning electron microscope to discriminably visualize the surface and the internal structure of a sample, by setting a split distance as a distance for intermittent irradiation and selecting one split distance based on sample information, will be described.

FIG. 1 shows an example of the configuration of the present scanning electron microscope. A scanning electron microscope 101 is configured with an electronic optical system, an intermittent irradiation system, a stage mechanism system, a control system, an image processing system, and an operation system. The electronic optical system has an electron gun 102, a deflector 103, an objective lens 104, and a detector 105. The intermittent irradiation system has a blanker 106, and a blanking controller 107 which applies a pulse cutoff voltage. The stage mechanism system has an XYZ stage 108, and a sample holder 109 on which a sample 210 is placed.

The control system has an electron gun controller 111, a deflection signal controller 112, an objective lens coil controller 113, a detector controller 114, an XYZ-stage controller 115, and a synchronous controller 116 for time synchronization among the blanking controller 107, the deflection signal controller 112, and the detector controller 114. A dynamic irradiation controller 117 to count the number of times of scanning and the number of times of image capturing, to change the phase of time synchronization, interval time between intermittent irradiations, and the interval between scannings, with the count value, is mounted in the synchronous controller 116.

The image processing system has a detection signal processor 118 and an image forming unit 119.

The operation system (image acquisition operation 126) has an image display unit 120 and a control parameter setting unit 121 for the control system including an operation interface. Further, the control parameter setting unit 121 has a scanning speed setting unit 122, a scanning interval setting unit 123 to set an interval between scannings, a split distance setting unit 124 to set plural intermittent irradiation distances, and a split distance selector 125 to select an intermittent irradiation distance.

An electron beam 100, emitted from the electron gun 102, accelerated and pulsated, is focused with the objective lens 104, and irradiated to the sample 210. The irradiation position on the sample is controlled with the deflector 103. Pulse secondary electrons 150, emitted from the sample 210 by irradiation of the electron beam 100, are guided, while influenced by the electric field on the sample, to the detector 105 and detected. Note that the pulse electron beam 100 is formed with the blanker 106. Further, it is possible to suppress damage to the sample by using electron beam, irradiated to the sample, at a voltage of 0 kV to 5 kV as acceleration voltage. However, it is desirable that the acceleration voltage is 3 kV or lower.

The scanning with the deflector 103, the intermittent irradiation, and the secondary electron detection, in synchronization, are controlled with the synchronous controller 116. The speed of scanning, the scanning interval, and the split distance, set with the operation interface, are stored, as a control time chart file, in the synchronous controller 116. The dynamic irradiation controller 117 to control parameters during image capturing inputs control signals to the blanking controller 107, the deflection signal controller 112, and the detector controller 114. Note that as the split distance, a distance from 5 nm to a distance shorter than 500 nm is available, however, it is desirable that the split distance is 100 to 300 nm. When the split distance is shorter than 5 nm or longer than 500 nm, it is not possible to obtain sufficient contrast.

Figure 2:
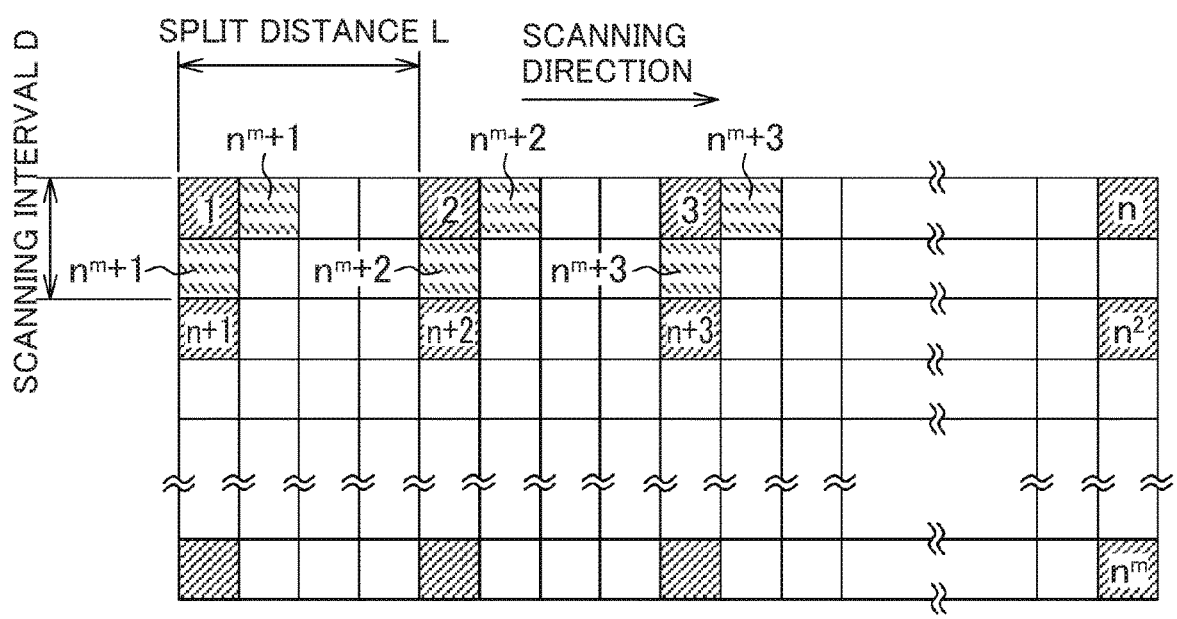
FIG. 2 is a diagram showing an example of an image forming algorithm in the electron microscope according to the first embodiment.

FIG. 2 shows an image acquisition algorithm in the electron microscope according to the present embodiment. In FIG. 2, the order of irradiation is indicated with numbers. With respect to a direction of electron beam scanning (lateral direction), the electron beam is irradiated to the sample in a split distance L selected with the split distance selector 125. The number of times n of irradiation during one scanning is determined based on the number of pixels forming an image, an irradiation pixel array for continuous irradiation, and the split distance. In the present embodiment, the irradiation pixel array for continuous irradiation is 1. The scanning is performed as thinned scanning in a vertical direction based on an interval D between scannings set with the scanning interval setting unit 123. When the scanning is repeated m times, the number of times of irradiation is $n^m$.

Next, as indicated with $n^m+1$ in FIG. 2, the next unirradiated region is irradiated. The split distance L upon irradiation from $n^m+1$ to $n^m+2$ and $n^m+3$ is controlled with the same distance. Further, as indicated with $n^m+1$ in FIG. 2, the next unirradiated region may be selected in the lateral direction or in the vertical direction. Finally all the regions are irradiated.

FIG. 3 shows a control time chart of deflection scanning control, irradiation control, and detection control. Control signals for scanning, irradiation, and detection are controlled in synchronization with a master clock. In the present embodiment, scanning, irradiation and detection are controlled in the same phase from 1 to n times of irradiation. Next, when the irradiation position is shifted in the lateral direction in the region $n^m+1$, as the irradiation pixel array has 1 pixel, the shifting is controlled with the irradiation and detection control signals to shift the phase by 1 pixel irradiation time with respect to the scanning control. The phase is controlled such that all the regions are finally irradiated. The obtained detection signal is stored, in consideration of irradiation position, in a storage. An image is formed by adding the detection signals obtained in all the irradiation regions and two-dimensionally displaying the added result.

Figures 4, 5:
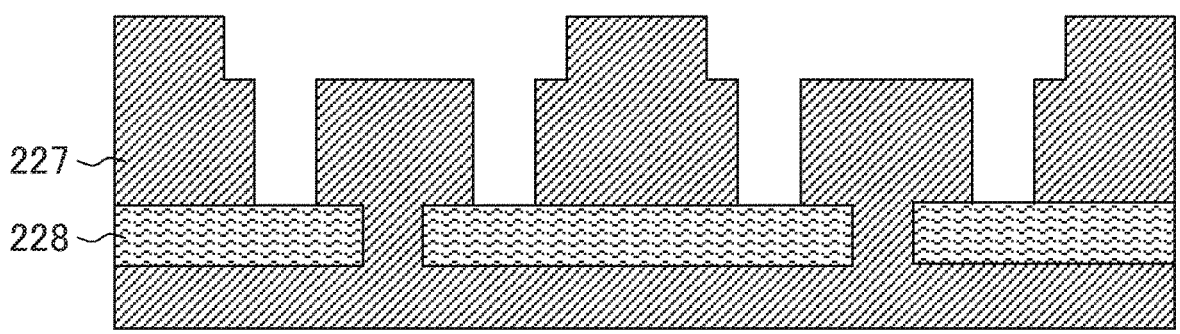
FIG. 4 is a diagram showing an example of a GUI in the electron microscope according to the first embodiment.
FIG. 5 is a diagram showing a cross-sectional structure of a sample used in the first embodiment.

FIG. 4 shows a GUI used in the present embodiment. The image acquisition operation 126 of the SEM has, in addition to basic observation conditions, i.e., acceleration voltage and irradiation current, a scanning speed setting unit 122, a scanning interval setting unit 123, a split distance setting unit 124 to set plural intermittent irradiation distances, and a split distance selector 125 to select an intermittent irradiation distance. Further, an image obtained based on the distance selected with the split distance selector 125 is displayed on the image display unit 120.

FIG. 5 shows a cross-sectional view of the sample used in the present embodiment. An insulation film 227 has a two-stage groove and hole structure. In an under layer, an oval shaped metal 228 is embedded.

Figure 6:
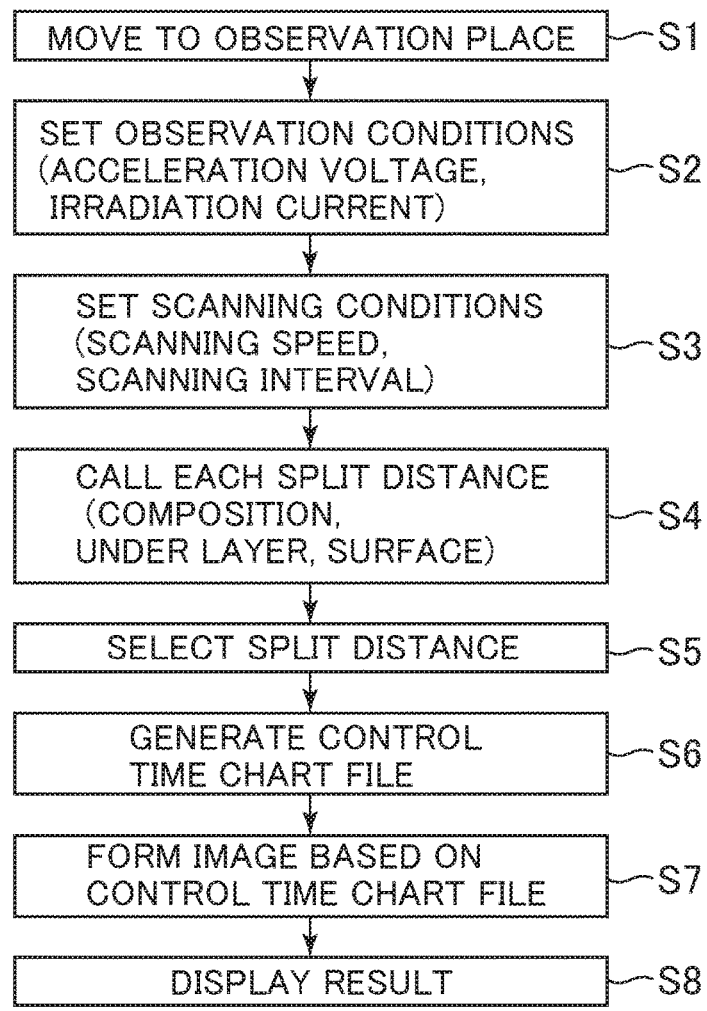
FIG. 6 is a diagram showing an example of a flowchart of image acquisition in the electron microscope according to the first embodiment.

FIG. 6 shows an image acquisition flow of setting the split distances, selecting a split distance and enabling discriminable observation of sample information. First, the irradiation position is moved to a sample observation position with the stage mechanism system (S1). The acceleration voltage and the irradiation current as the basic observation conditions are set by using the image acquisition operation 126 of the SEM (S2). At this time, focus and nonpoint are adjusted. Next, the scanning speed and the scanning interval as scanning conditions are set with the scanning speed setting unit 122 and the scanning interval setting unit 123 (S3). Further, the split distance upon acquisition of information on composition, under layer and surface is set with the split distance setting unit 124 (S4). In the present embodiment, a previously-set split distance was called from a database. Next, a split distance based on sample information to be analyzed is selected with the split distance selector 125 (S5). Then a control time chart file is generated based on the scanning and split distance conditions set at step S3 and step S5 (S6). In the flow of the present embodiment, the control time chart file is generated upon condition setting, however, it maybe configured such that the control time chart file on the respective conditions is previously generated, and called from the storage of the device after setting of the conditions. The control time chart file is written in the synchronous controller 116, and the blanking controller 107, the deflection signal controller 112, and the detector controller 114 are time-synchronously controlled, to form an image (S7). The formed image is displayed on the image display unit 120, and storage processing is performed (S8).

Figure 7:
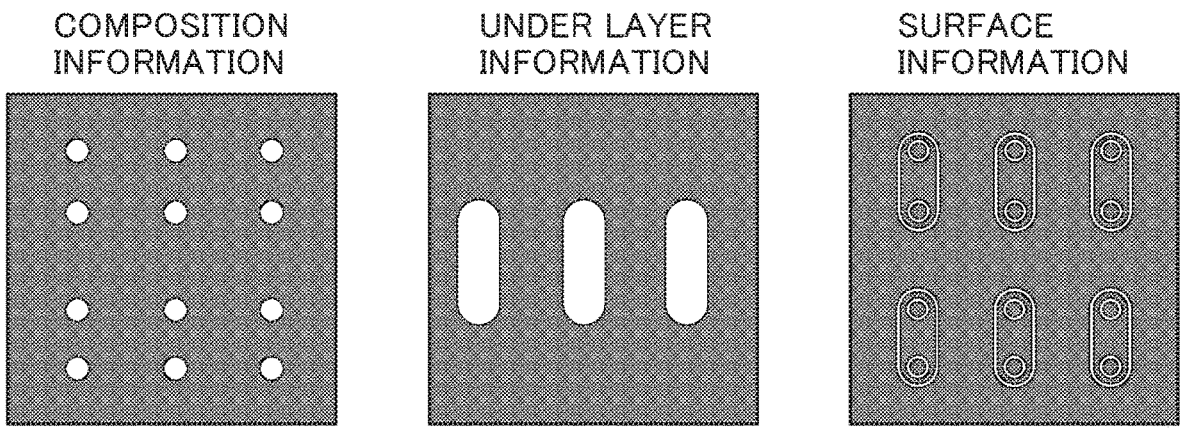
FIG. 7 is a diagram showing an example of a SEM image obtained with the electron microscope according to the first embodiment.

FIG. 7 shows a SEM image in the present embodiment. In FIG. 7, a left diagram, a middle diagram, and a right diagram respectively show composition information, under layer information, and surface information. In FIG. 7, the sample information is discriminably visualized in correspondence with split distance selected with the split distance selector 125. In this manner, by using the present embodiment, it is possible to easily obtain an image with different sample information by selection of split distance.

As described above, according to the present embodiment, it is possible to provide a charged particle beam device which enables observation and evaluation of surface and inside of a sample with low damage to the sample.

Second Embodiment

Figure 8:
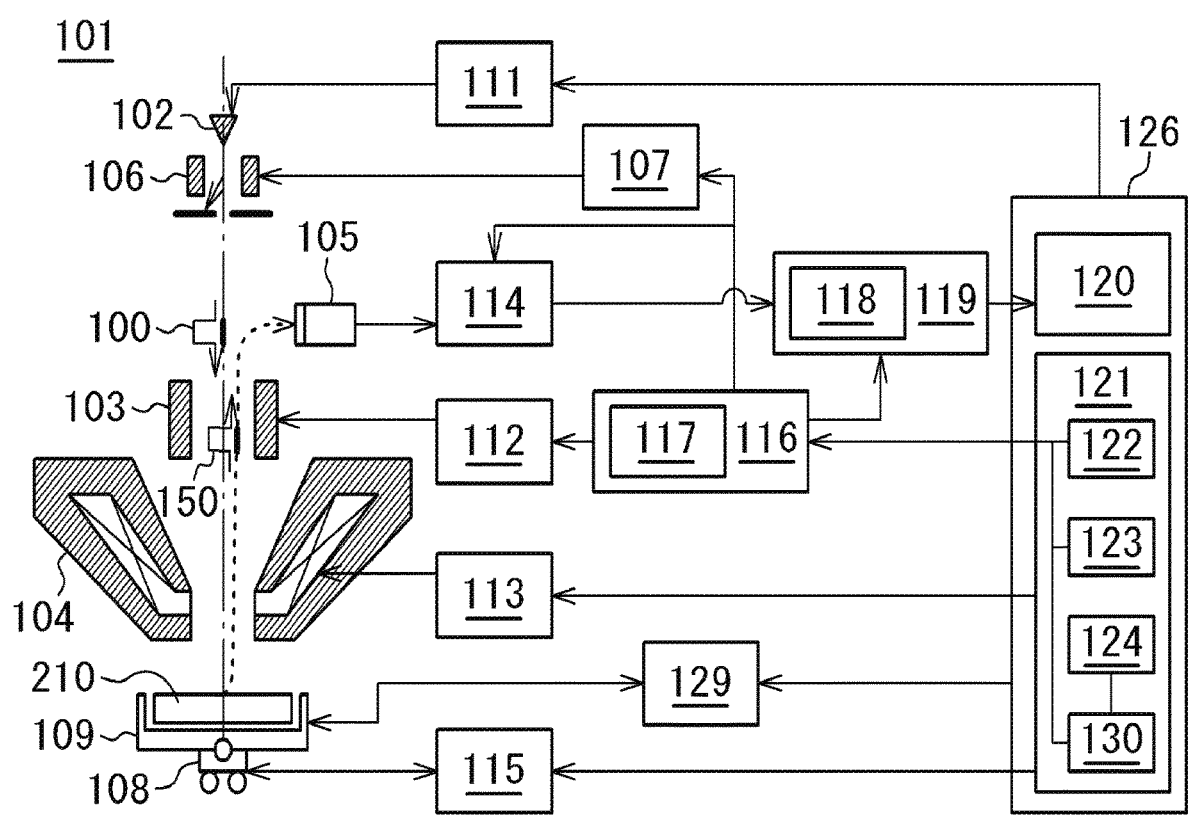
FIG. 8 is a configuration cross-sectional diagram (partial block diagram) showing an example of the charged particle beam device (electron microscope) according to second, third and fourth embodiments.

The scanning electron microscope according to a second embodiment of the present invention will be described using FIGS. 8 to 10. Note that the matters described in the first embodiment but not described in the present embodiment are applicable to the present embodiment unless there are special circumstances.

In the present embodiment, the device to obtain a SEM image including plural sample information pieces by selecting plural split distances as intermittent irradiation distances will be described. FIG. 8 shows an example of the configuration of the scanning electron microscope according to the present embodiment. The basic configuration of the present scanning electron microscope is the same as that shown in FIG. 1. The present scanning electron microscope is provided with a sample voltage controller 129 to apply a bias voltage to the sample, and further provided with a split distance selector 130 for selecting plural split distances for intermittent irradiation. FIG. 9 shows the image acquisition algorithm in the present scanning electron microscope. The electron beam 100 is scanned in the lateral direction, and while the irradiation position is moved in the vertical direction, as indicated with i=1, 2, 3, the electron beam 100 is repeatedly scanned in the lateral direction. The split distance is controlled by performing intermittent irradiation and detection in synchronization with the scanning. In the present embodiment, three split distances, L1, L2, and L3 are set. Upon each scanning, control is performed with the three split distances. For example, the split distance L1 is set in i=1; the split distance L2 is set in i=2; the split distance L3 is set in i=3; and the split distance L1 is set in i=4. Thus, the split distance L1 is set in i=3n+1 (n=0, 1, 2, 3), the split distance L2 is set in i=3n+2, and the split distance L3 is set in i=3n+3.

In the present embodiment, an image formed upon completion of the movement in the vertical direction will be referred to as a field. As one field includes unirradiated region(s), as in the case of the first embodiment, while the phase of the signals for scanning, irradiation, and detection are shifted, irradiation and detection are performed on all the regions. In the second field, the split distance L1 is set in i=3n+2, the split distance L2 is set in i=3n+3, and the split distance L3 is set in i=3n+1. Then in the third field, the split distance L1 is set in i=3n+3, the split distance L2 is set in i=3n+1, and the split distance L3 is set in i=3n+2. Thus the order of scanning upon setting of the split distance is changed by field. In the present embodiment, the order of scanning upon setting of the split distance is changed by filed, however, the split distance may be set by field in the same order. As a SEM image, one image is formed by adding the signals of the respective field images.

Figure 10:
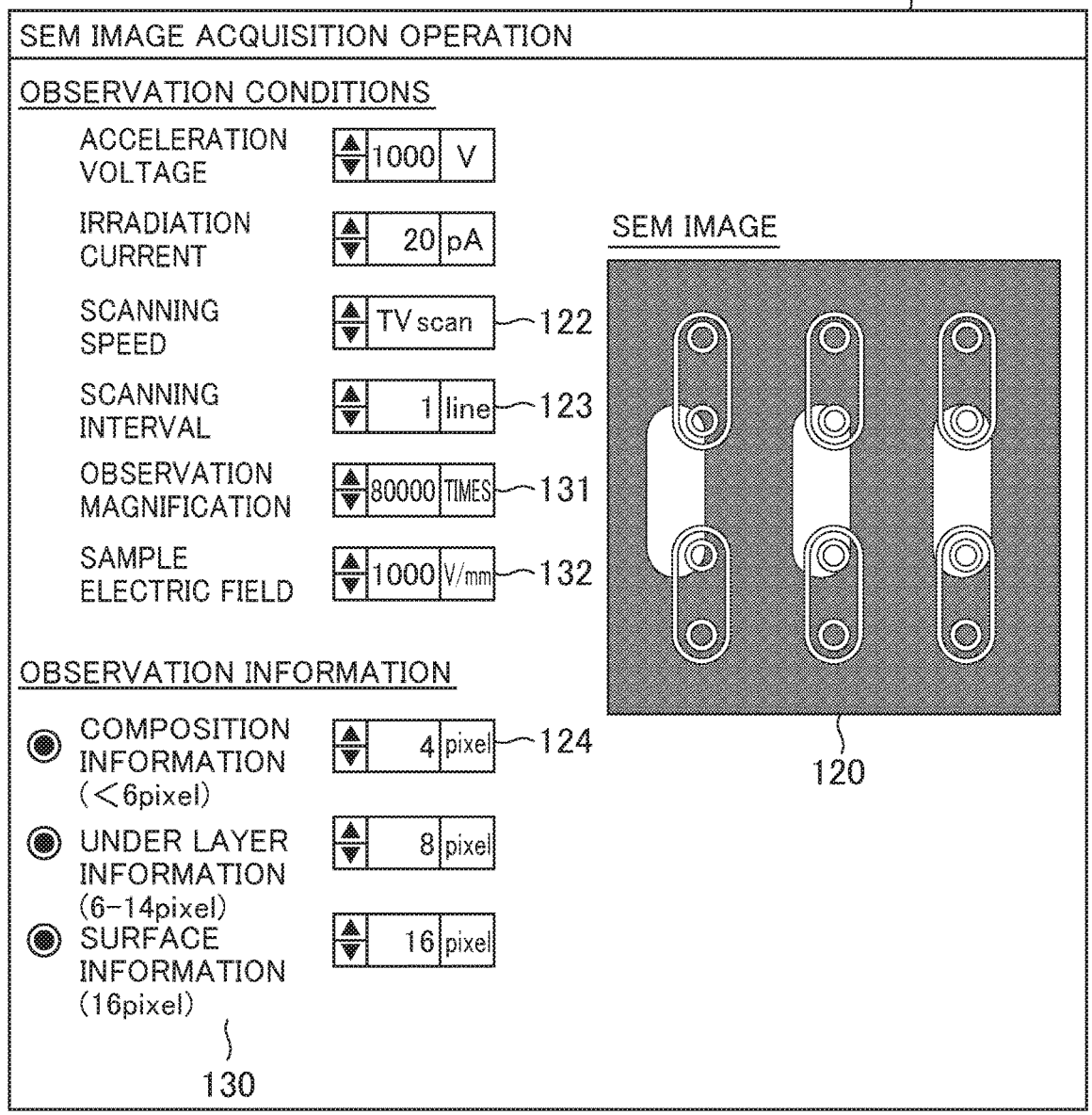
FIG. 10 is a diagram showing an example of the GUI in the electron microscope according to the second embodiment.

FIG. 10 shows the GUI used in the present embodiment. The image acquisition operation 126 of the SEM has, in addition to the basic observation conditions, i.e., the acceleration voltage and the irradiation current, the scanning speed setting unit 122, the scanning interval setting unit 123, the split distance setting unit 124 to set plural distances for intermittent irradiation, and the split distance selector 130 for setting plural distances for intermittent irradiation. Further, the image obtained based on the plural distances selected with the split distance selector 130 is displayed on the image display unit 120. Further, in the present embodiment, the split distance is set by using a setting method in pixel unit. The split distance is controlled with a distance corresponding to a designated number of pixels.

The image acquisition operation 126 of the SEM is provided with a function of setting an observation magnification 131 and a sample electric field 132. The number of pixels displayed on the split distance setting unit 124, for setting plural intermittent irradiation distances, changes in correspondence with the setting of the observation magnification 131 and the sample electric field 132. As the observation magnification 131 is increased, the pixel size becomes smaller. Thus the required number of pixels for split distance is increased. Further, as the sample electric field 132 is enlarged, the lateral interaction is weakened. Accordingly, the split distance necessary for information discrimination is shortened, and the required number of pixels is smaller. The flow of image acquisition is the same as that in FIG. 6 in the first embodiment. In the present embodiment, at step S5 in FIG. 6, plural split distances are selected. In the present embodiment, as three split distances, four pixels, eight pixels, and sixteen pixels are selected. A control time chart based on the image algorithm shown in FIG. 9 is generated, and written in the synchronous controller 116. The sample the same as that used in the first embodiment is used. In the GUI shown in FIG. 10, a SEM image is displayed, and it is understood that an image where information on the composition, information on the under layer, and information on the surface are overlaid is formed.

In this manner, according to the present embodiment, it is possible to obtain the same advantages as those obtained in the first embodiment. Further, it is possible to obtain a SEM image including plural sample information pieces by selecting plural split distances.

Third Embodiment

The scanning electron microscope according to a third embodiment of the present invention will be described using FIGS. 11 to 15. Note that the matters described in the first or second embodiment but not described in the present embodiment are applicable to the present embodiment unless there are special circumstances.

In the present embodiment, the electron microscope having a defect inspection function using a SEM image obtained by controlling the split distance will be described. In the present embodiment the scanning electron microscope shown in FIG. 8 was used. Further, as the image acquisition algorithm, an algorithm shown in FIG. 2 was used.

Figure 11:
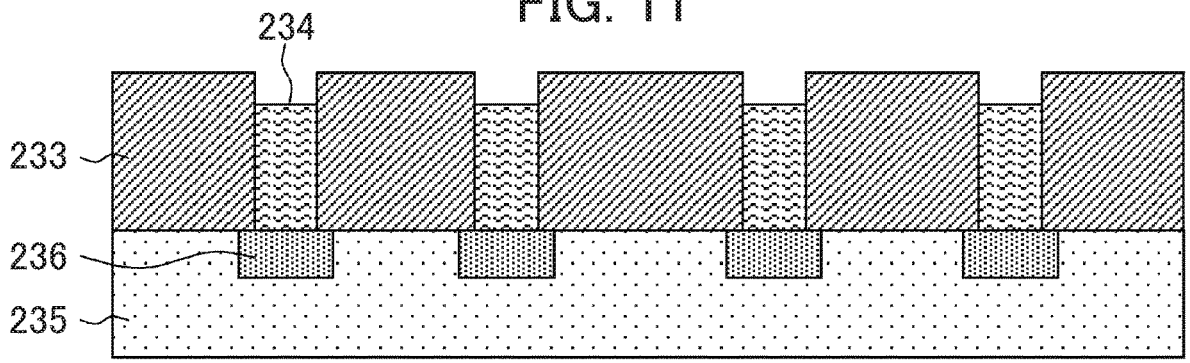
FIG. 11 is a diagram showing a cross-sectional structure of the sample used in the third embodiment.

FIG. 11 shows a cross-sectional view of the sample used in the present embodiment. A conductive contact plug 234 is embedded in an insulation film 233. An n-type doping region 236 ion-implanted in a p-type silicon substrate 235 is formed in the under layer of the contact plug 234, thus forming a pn junction between the silicon substrate and the doping region. In the present embodiment, in an example where electric characteristic defect in the embedded pn junction or surface pattern defect is inspected will be described.

Figure 12:
FIG. 12 shows a SEM image for explanation of a method for optimizing image acquisition conditions in the electron microscope according to the third embodiment.

To previously generate an inspection recipe, a split distance most appropriate to electric characteristic defect or surface pattern defect is extracted. FIG. 12 shows a SEM image obtained with a split distance set in pixel unit and a scanning interval set in scanning-line unit. As the present result, an image is obtained with a combination of the ranges of the split distance and the scanning-line interval designated in a recipe generation tool, and is displayed in matrix. A user extracts most appropriate conditions for electric character defect or surface pattern defect with the image quality and the contrast value of the present result. In FIG. 12, as conditions for electric characteristic defect inspection, the scanning interval: 4 lines, and the split distance: 16 pixels are extracted. Further, as conditions for shape defect inspection, the scanning interval: 16 lines, and the split distance: 32 pixels are extracted.

FIG. 13 shows an example of the GUI in the scanning electron microscope according to the present embodiment. A split distance selector 137 is used for selecting electric characteristic defect or surface pattern defect. The most appropriate values extracted in FIG. 12 are inputted in the split distance setting unit 124 and the scanning interval setting unit 123. In the image obtained on the present conditions, defect determination is made by comparison with an image obtained in different place or pattern design information. Upon defect determination, the coordinates and type of the defect are stored in the storage of the device.

In this manner, according to the present embodiment, it is possible to obtain the same advantages as those obtained in the first embodiment. Further, it is possible to selectively inspect electric character defect or pattern defect of the sample by selection of the scanning interval and the split distance.

Fourth Embodiment

The scanning electron microscope according to a fourth embodiment of the present invention will be described using FIGS. 14 to 17. Note that the matters described in any one of the first to third embodiments but not described in the present embodiment are applicable to the present embodiment unless there are special circumstances.

Figure 14:
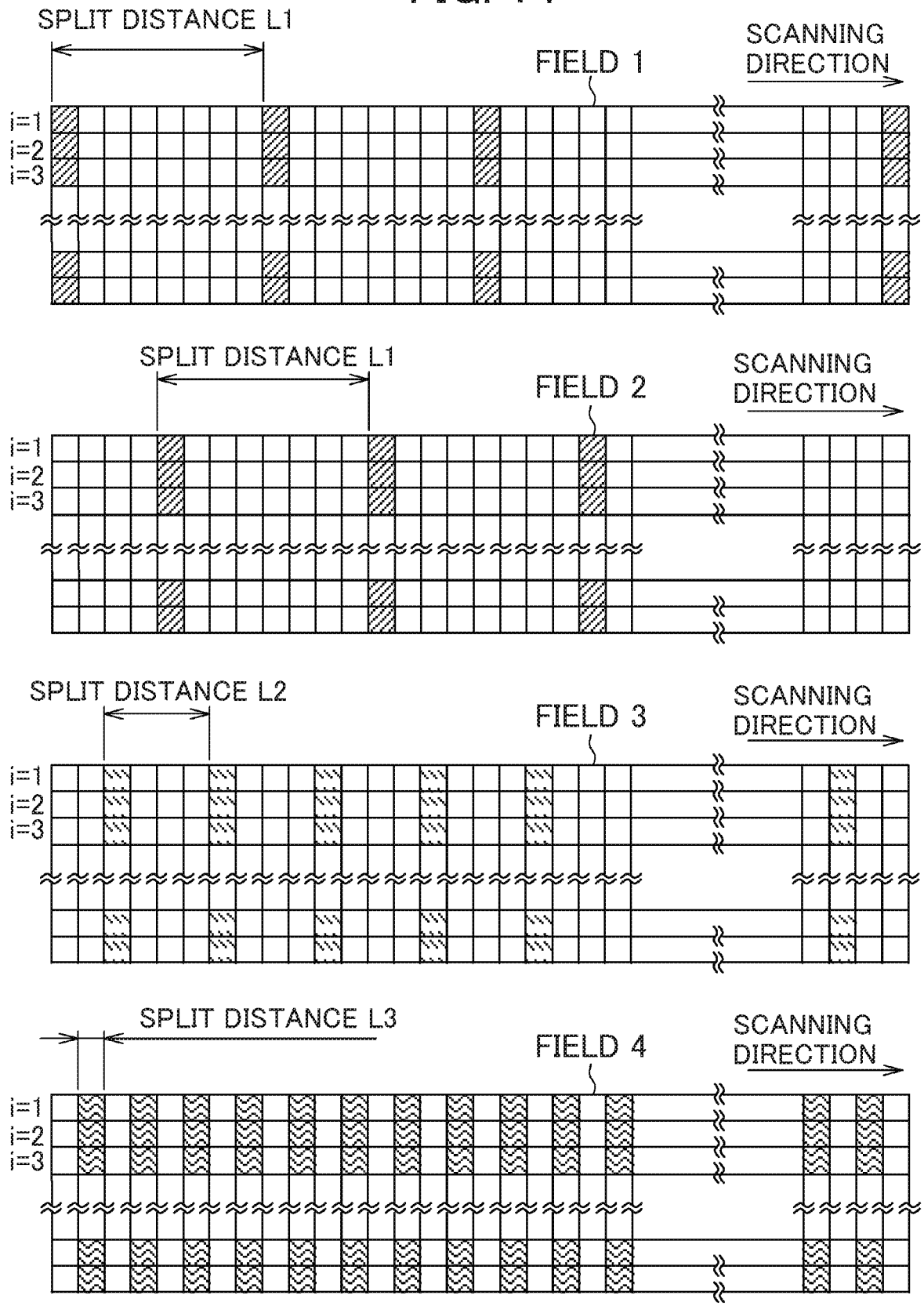
FIG. 14 is a diagram showing an example of the image forming algorithm in the electron microscope according to the fourth embodiment.
Figure 15:
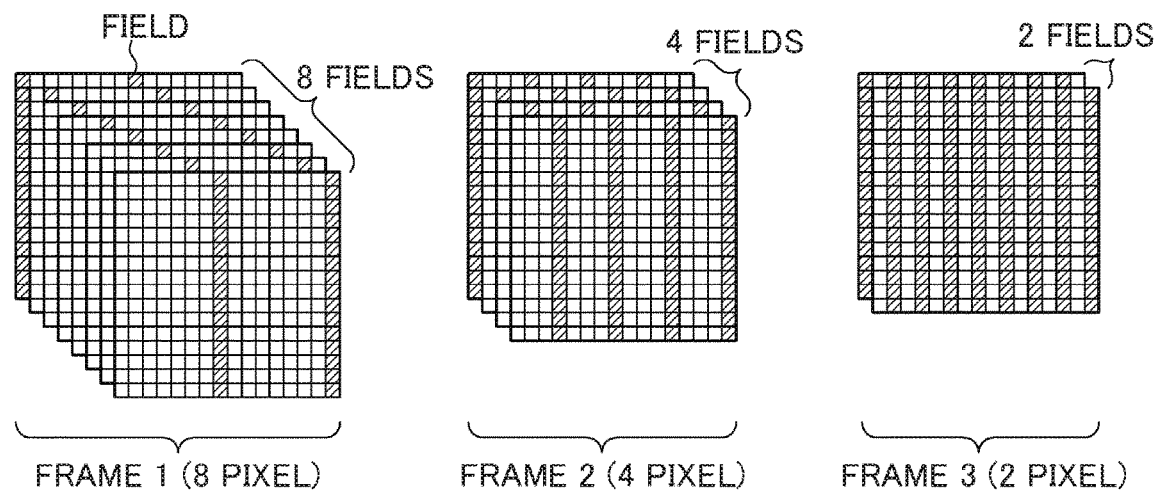
FIG. 15 is a diagram showing another example of the image forming algorithm in the electron microscope according to the fourth embodiment.

In the present embodiment, the electron microscope having a function of measuring alignment between different layers using a SEM image obtained by controlling plural split distances will be described. In the present embodiment, the scanning electron microscope shown in the above-described FIG. 8 is used. FIGS. 14 and 15 show the image acquisition algorithm. The algorithm shown in FIG. 14 is to select a split distance by field. In the fields 1 and 2, eight pixels as the same split distance are used. In the field 2, the phase is controlled so as to irradiate an intermediate position in the split distance in the field 1. In the field 3, four pixels as the split distance are used, and the phase is controlled so as to irradiate an intermediate position between the irradiation in the fields 1 and the irradiation in the field 2. In the field 4, two pixels as the split distance are used, and the phase is controlled so as to irradiate an intermediate position among the irradiation in the field 1, the irradiation in the field 2, and the irradiation in the field 3.

Further, FIG. 15 shows a method of controlling the split distance by image (frame) to which a field obtained in the same split distance is added. In a frame 1, eight pixels as the split distance are used. In a frame 2, four pixels as the split distance are used. In a frame 3, two pixels as the split distance are used.

Figure 9:
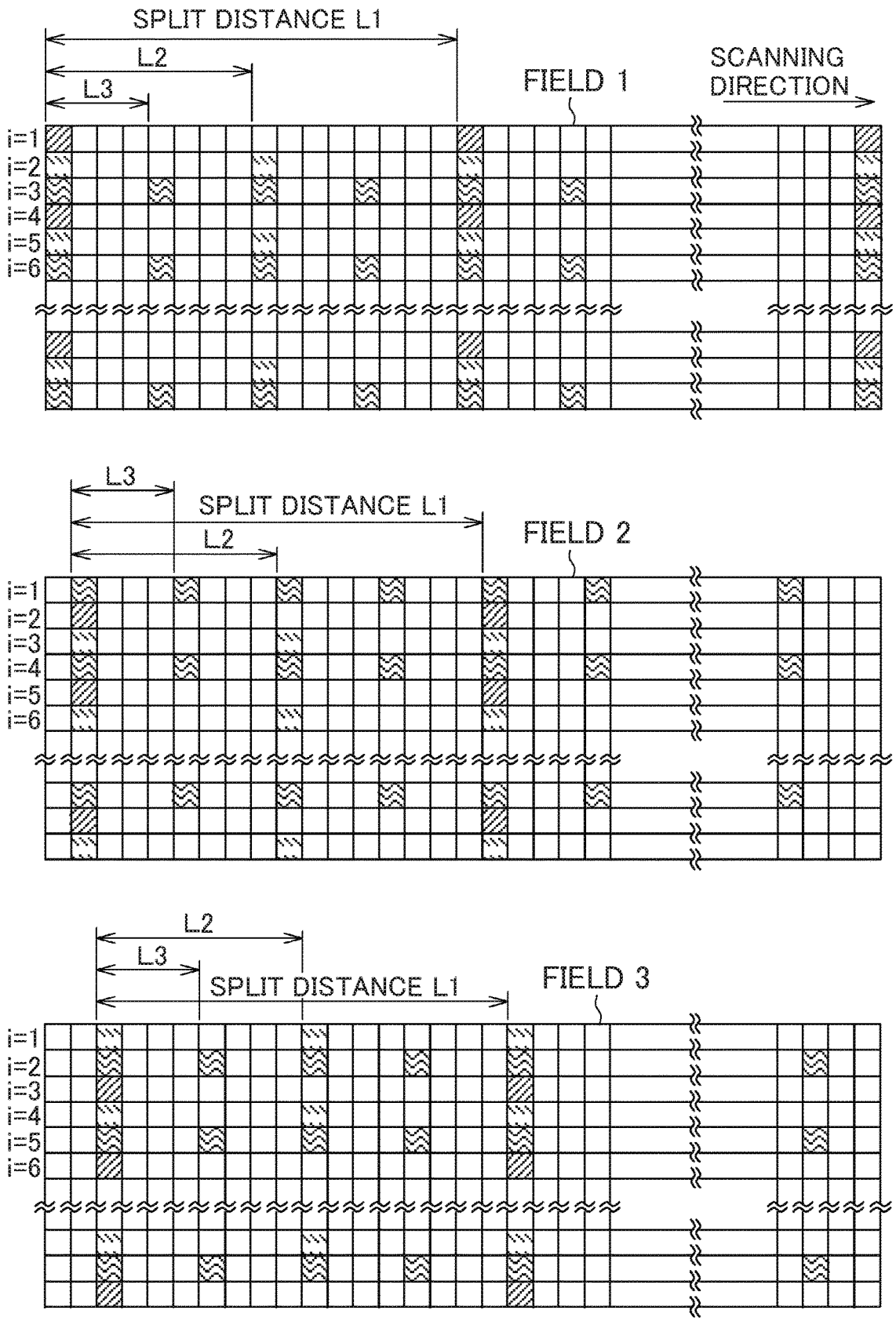
FIG. 9 is a diagram showing an example of the image forming algorithm in the electron microscope according to the second embodiment.
Figure 16:
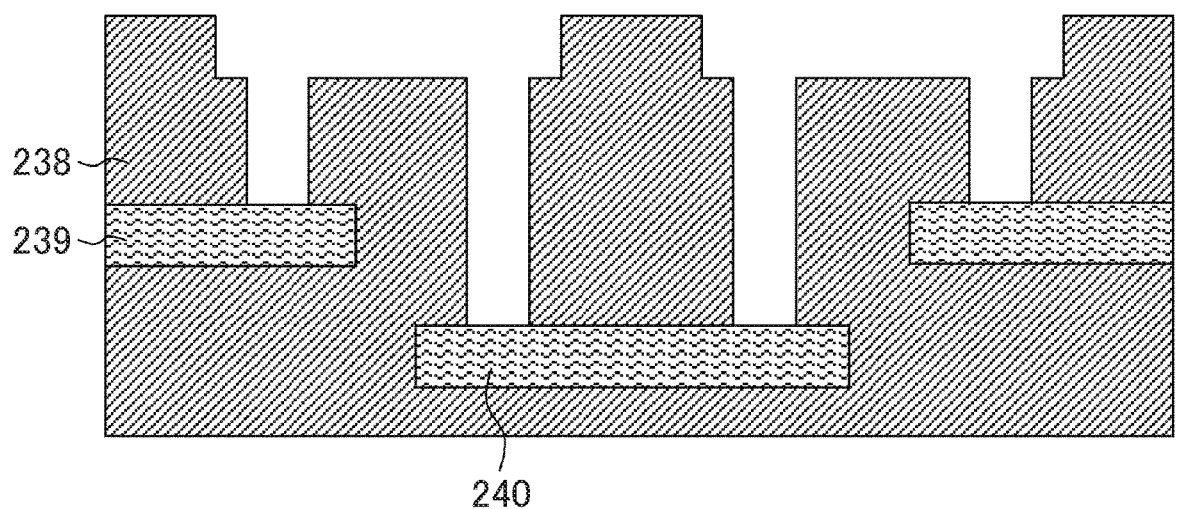
FIG. 16 is a diagram showing a cross-sectional structure of the sample used in the fourth embodiment.

The scanning electron microscope according to the present embodiment has a function of selecting the algorithm in FIG. 9 to select the split condition by scanning line and the algorithms in FIGS. 14 and 15, with the GUI. FIG. 16 shows the sample used in the present embodiment. As an under layer 1 of an insulation film 238, a wiring pattern 239 is formed, and as an under layer 2, a wiring pattern 240 is formed.

FIG. 17 shows an example of the GUI in the scanning electron microscope according to the present embodiment. The image acquisition operation 126 of the SEM is provided with a distance selector 141 for setting split distance selection timing, and a split distance selector 142 for selecting plural layer information pieces (surface, under layer 1, and under layer 2) of a sample to be analyzed. With an image obtained on the present conditions, the center of gravity position between the layers is analyzed, and the alignment amount between the layers is measured.

In this manner, according to the present embodiment, it is possible to obtain the same advantages as those obtained in the first embodiment. Further, it is possible to measure the alignment amount between the layers of the sample by selection of plural split distances in correspondence with the layer structure of the sample.

Note that the present invention is not limited to the above-described embodiments, but includes various modifications. For example, the above-described embodiments have been described in detail for clearly explaining the present invention, and the present invention is not necessarily limited to an embodiment having all the described constituent elements. Further, a part of constituent elements of an embodiment may be replaced with those of another embodiment. Further, constituent elements of an embodiment may be added to those of another embodiment. Further, it is possible to perform addition/deletion/replacement with respect to some of constituent elements of the respective embodiments with other constituent elements.

REFERENCE SIGNS LIST

100 . . . pulse electron beam, 101 . . . scanning electron microscope, 102 . . . electron gun, 103 . . . deflector, 104 . . . objective lens, 105 . . . detector, 106 . . . blanker, 107 . . . blanking controller, 108 . . . XYZ stage, 109 . . . sample holder, 111 . . . electron gun controller, 112 . . . deflection signal controller, 113 . . . objective lens coil controller, 114 . . . detector controller, 115 . . . XYZ stage controller, 116 . . . synchronous controller, 117 . . . dynamic irradiation controller, 118 . . . detection signal processor, 119 . . . image forming unit, 120 . . . image display unit, 121 . . . control parameter setting unit, 122 . . . speed setting unit, 123 . . . scanning interval setting unit, 124 . . . split distance setting unit, 125 . . . split distance selector, 126 . . . image acquisition operation, 129 . . . sample voltage controller, 130 . . . split distance selector, 131 . . . observation magnification, 132 . . . sample electric field, 137 . . . split distance selector, 141 . . . distance selector, 142 . . . split distance selector, 150 . . . secondary electron, 210 . . . sample, 227 . . . insulation film, 228 . . . metal, 233 . . . insulation film, 234 . . . contact plug, 235 . . . silicon substrate, 236 . . . n-type doping region, 238 . . . insulation film, 239 . . . wiring pattern (under layer 1), and 240 . . . wiring pattern (under layer 2).

The invention claimed is:

1. A charged particle beam device comprising:
a charged particle beam source;
a sample table on which a sample is placed;
a charged particle beam optical system that accelerates and pulsates a charged particle beam emitted from the charged particle beam source, and irradiates the charged particle beam to the sample at an acceleration voltage within a range of 0 kV to 5 kV while scanning the charged particle beam; and
a controller that controls the charged particle beam optical system based on a split distance set as a same pixel distance between successive irradiation regions in a scanning direction for one scanning line of the charged particle beam on the sample, based on a measurement object comprising a surface or an under layer of the sample, so as to irradiate the charged particle beam to the sample without causing damage to the sample,
wherein the split distance is set based on an electrostatic capacitance from a previous irradiation of the sample by the charged particle beam, and
wherein the split distance is set to a plurality of values, each said value being a same value within each of a plurality of scanning lines, and each said value being different between each different scanning line of said plurality of scanning lines.

2. The charged particle beam device according to claim 1, wherein the acceleration voltage of the charged particle beam irradiated to the sample is set to a value within a range of 0 kV to 3 kV.

3. The charged particle beam device according to claim 1, wherein the split distance is set to a value within a range of 5 nm to 500 nm.

4. The charged particle beam device according to claim 1, wherein the split distance is set to a first pixel distance which is the same in each of a plurality of first fields, and to a second pixel distance in which is the same in each of a plurality of second fields.

5. The charged particle beam device according to claim 4, wherein a first frame includes a plurality of added first fields in which the split distance has the first pixel distance, and
wherein a second frame includes a plurality of added second fields in which the split distance has the second pixel distance.

6. A charged particle beam device comprising:
a charged particle beam source;
a sample table on which a sample is placed;
a charged particle beam optical system that accelerates and pulsates a charged particle beam emitted from the charged particle beam source, and irradiates the charged particle beam to the sample at an acceleration voltage within a range of 0 kv to 5 kV while scanning the charged particle beam;
a GUI that displays a split distance setting screen for setting a split distance as a same pixel distance between successive irradiation regions in a scanning direction of one line scanning of the charged particle beam on the sample, based on a measurement object selected with a split distance selection screen for selecting a surface or an under layer of the sample as the measurement object and the split distance selection screen; and
a controller that controls the charged particle beam optical system to irradiate the charged particle beam to the sample without causing damage to the sample based on the split distance set with the split distance setting screen,
wherein the split distance is set based on an electrostatic capacitance from a previous irradiation of the sample by the charged particle beam, and
wherein the split distance is set to a plurality of values, each said value being a same value within each of a plurality of scanning lines, and each said value being different between each different scanning line of said plurality of scanning lines.

7. The charged particle beam device according to claim 6,
wherein the acceleration voltage of the charged particle
beam irradiated to the sample is set to a value within a
range of 0 kv to 3 kv.

8. The charged particle beam device according to claim 6,
wherein the split distance is set to a value within a range
of 5 nm to 500 nm.

9. The charged particle beam device according to claim 6,
wherein the split distance selection screen includes a
screen for selecting under layer information or an
electric characteristic.

10. The charged particle beam device according to claim 6,
wherein the split distance selection screen includes a
screen for selecting composition information, under
layer information, or surface information.

11. The charged particle beam device according to claim 10,
wherein the unit of the split distance is pixel.

12. The charged particle beam device according to claim 6,
wherein the split distance selection screen includes a
screen for selecting an electric characteristic, a scanning interval corresponding to the electric characteristic, a surface shape, or a scanning interval with respect
to the surface shape.

13. The charged particle beam device according to claim 6,
wherein the split distance selection screen includes a
screen for selecting surface information, under layer
first information, or under layer second information.

* * * * *